United States Patent [19]

Garner et al.

[11] Patent Number: 4,792,986

[45] Date of Patent: Dec. 20, 1988

[54] PORTABLE RADIO SYSTEM WITH EXTERNALLY PROGRAMMABLE UNIVERSAL DEVICE CONNECTOR

[75] Inventors: Terry N. Garner, Lynchburg; Ralph R. Sherman, Jr., Forest, both of Va.

[73] Assignee: General Electric Company, Lynchburg, Va.

[21] Appl. No.: 807,645

[22] Filed: Dec. 11, 1985

[51] Int. Cl.$^4$ .............................................. H04B 1/38
[52] U.S. Cl. ...................................... 455/89; 455/68; 455/186
[58] Field of Search .................. 455/89, 90, 161, 165, 455/183, 185, 186, 347, 351, 168, 67, 68, 58, 343, 76, 226, 88; 379/58

[56] References Cited

U.S. PATENT DOCUMENTS

| | | |
|---|---|---|
| 1,968,557 | 7/1934 | Johanson . |
| 2,560,320 | 2/1951 | Winkler . |
| 2,963,577 | 12/1960 | Errichiello et al. . |
| 3,090,027 | 5/1963 | Philips et al. . |
| 3,102,248 | 8/1963 | Temple . |
| 3,458,806 | 2/1966 | Snow . |
| 3,464,012 | 8/1969 | Webb . |
| 3,504,188 | 3/1970 | Ficker . |
| 3,577,076 | 5/1971 | Frushour . |
| 3,614,629 | 10/1971 | Sues . |
| 3,710,874 | 3/1973 | Gorcik et al. . |
| 3,943,440 | 3/1976 | Edwards . |
| 4,006,396 | 2/1977 | Bogut . |
| 4,021,672 | 5/1977 | Douglass et al. . |
| 4,073,564 | 2/1978 | Davis, Jr. . |
| 4,131,851 | 12/1978 | Martiny et al. . |
| 4,177,426 | 12/1979 | Gaishem et al. . |
| 4,286,335 | 8/1981 | Eichler et al. . |
| 4,348,771 | 9/1982 | Klank et al. ............... 455/185 |
| 4,435,844 | 3/1984 | Meyerhoff et al. ........... 455/343 |
| 4,476,467 | 10/1984 | Terwilliger et al. .......... 455/58 |
| 4,491,792 | 1/1985 | Bullock et al. . |
| 4,578,628 | 3/1986 | Siwiak ........................ 455/89 |
| 4,578,730 | 3/1986 | McKee et al. . |
| 4,648,125 | 4/1987 | Brown ........................ 455/89 |

FOREIGN PATENT DOCUMENTS 0018319 10/1980 European Pat. Off. ............ 455/90
1581679 12/1980 United Kingdom .
2155263 9/1985 United Kingdom .

OTHER PUBLICATIONS

Funkschau, No. 16, Aug. 1984, Munchen (DE) H., Winklemann: "Sprechfunk nach Mass.", pp. 41–43.
Nachrichten Electronik & Telematik, vol. 38, No. 4, Apr. 1984, Heidelberg (DE) S. Recklies: "Handsprechfunkgerate fur den Weltmarkt," pp. 134–137.
Phillips Telecommunication Reviews, vol. 42, No. 2, Jun. 1984, Hilversum (NL) Q. Reni et al.: "PFX, A New Universal Portable," pp. 49–62.
Philips Telecommunication Review, vol. 41, No. 3, Sep. 1983, Hilversum (NL) J. McLean: "A New Family of FM Portables," pp. 250–256.
Patent Abstracts of Japan, vol. 7, No. 214, (E-199)(1359) Sep. 21, 1983, & JP, A, 58-106920 (Matsushita Denki Sangyo k.k.) Jul. 25, 1983.

Primary Examiner—Robert L. Griffin
Assistant Examiner—Curtis A. Kuntz
Attorney, Agent, or Firm—Nixon & Vanderhye

[57] ABSTRACT

A computer-controlled portable radio communications device has RF and audio circuits controlled by a programmed computer in accordance with a predetermined modus operandi and includes an externally accessible multi-point electrical connector having input/output connections which communicate with the programmed computer. The computer is programmed to monitor the electrical impedance externally connected to at least one contact point of the connector and to alter the modus operandi of the portable radio system in response to such monitoring. In the exemplary embodiment, each of plural different types of accessory devices include a predetermined electrical impedance uniquely corresponding to that particular accessory device. The circuits are arranged so that no damage can be inflicted by accidental external electrical short circuits which the user may accidentally cause. Instead, an audible warning tone may be sounded if an improper electrical short circuit or other improper electrical impedance is connected a cross certain of the externally accessible contact points.

21 Claims, 4 Drawing Sheets

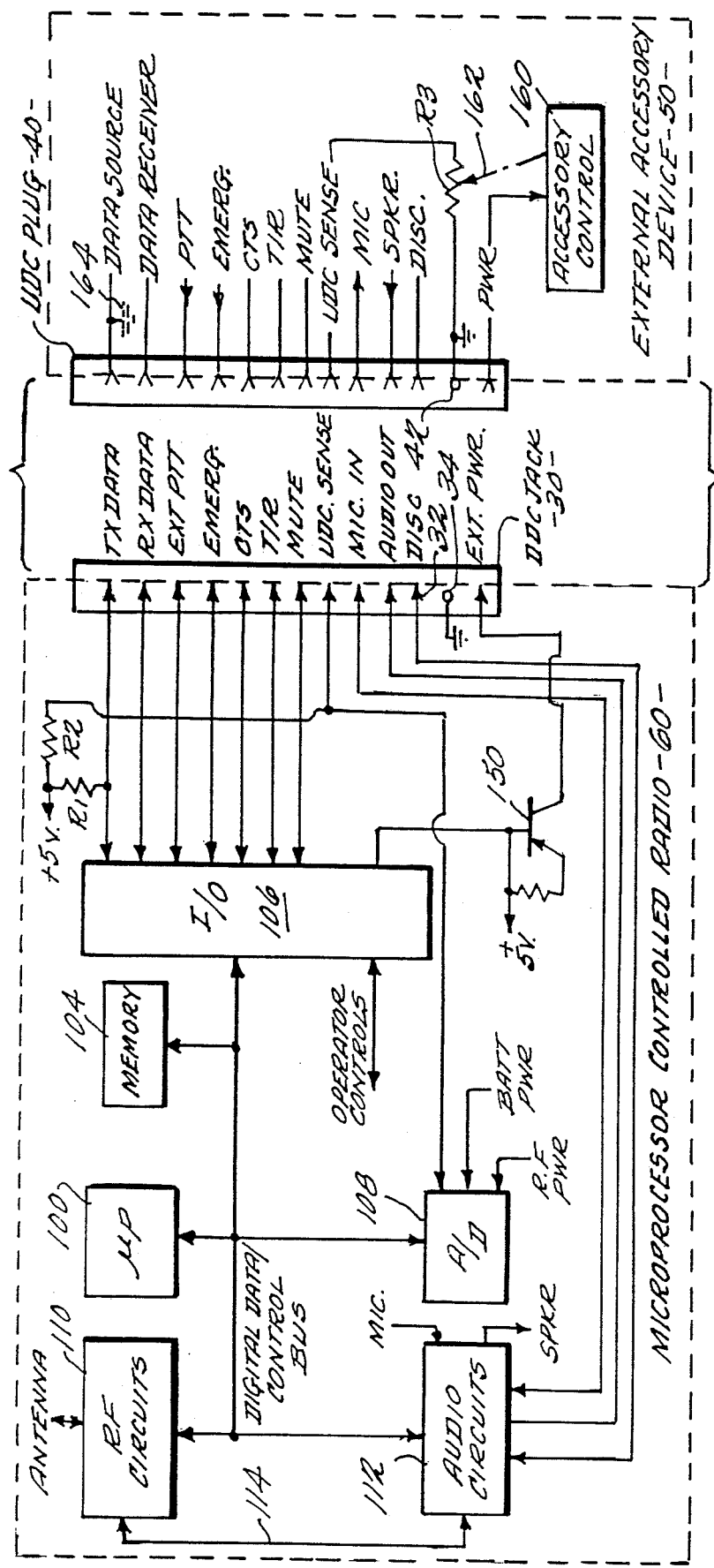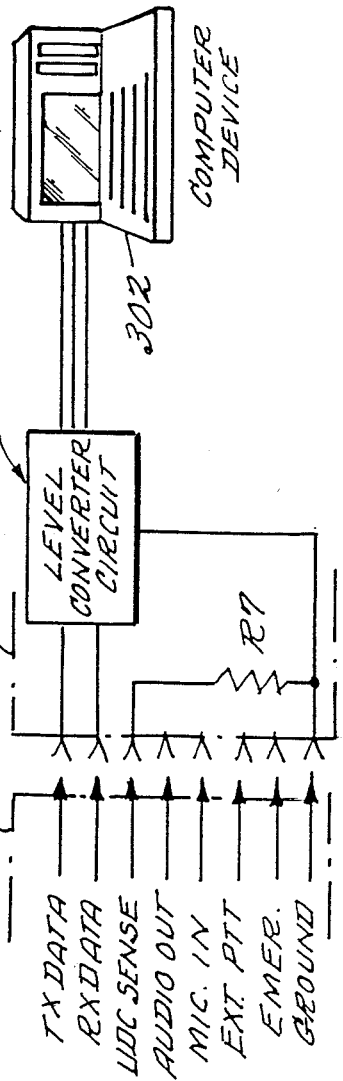
FIG. 2
FIG. 6

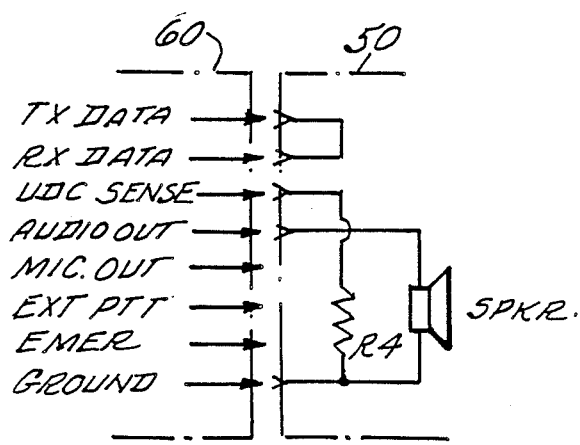
FIG. 3
FIG. 4
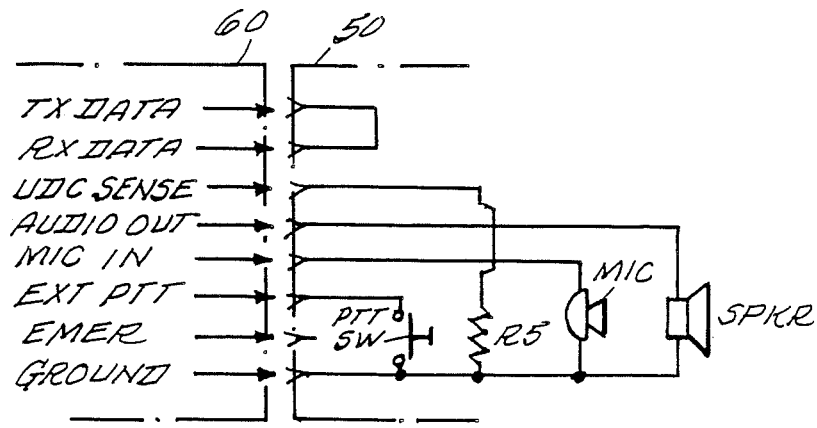
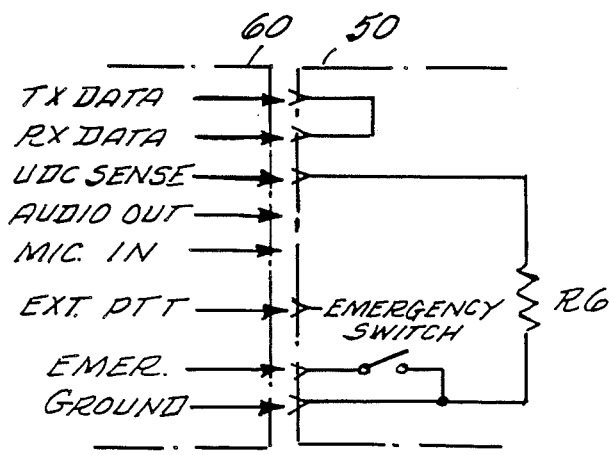
FIG. 5

PORTABLE RADIO SYSTEM WITH EXTERNALLY PROGRAMMABLE UNIVERSAL DEVICE CONNECTOR

This application is generally directed to portable radio systems having externally accessible multi-point electrical connectors for connecting associated accessory devices.

This application is related to commonly assigned co-pending U.S. patent application Ser. Nos. 844,158 (filed Mar. 26, 1986) and 791,022 (filed Oct. 24, 1985, now allowed) in which I am also named as an inventor.

Portable "personal" radio systems are now commonplace. They are often hand held or received within some sort of harness assembly strapped to a user for ready access. They may also be temporarily stored in the pockets of a user's clothing, strewn about desks, dashboards, etc.. In such an environment, it is not surprising to have the external surfaces of the radio device come into contact with electrical conductors (e.g., coins, pens, etc.) also commonly found in the same environment.

It is also common to provide a multi-point electrical connector which is externally accessible at the external surfaces of such a personal portable radio system. A wide variety of radio accessories can in this manner be electrically interconnected so as to become an integral part of the portable radio system. Such accessories may be used to provide remote control operations for user convenience and/or to provide functions which may not be available within the basic radio unit.

If an internal source of electrical energy is connected to one of the externally accessible contact points, (e.g., so as to provide power to the external device from the internal rechargeable battery pack of the basic radio unit), then an accidental short circuit at the exposed connector contacts may cause internal damage to the radio (e.g., by exceeding the power dissipation capability of certain components, by blowing a fuse, etc.). This situation is further aggravated by recent universal device connector jack designs where the contact points are either flush mounted at an external surface or only slightly recessed. Such jack designs are useful because they tend to accumulate less dirt in actual use (e.g., since recesses are not provided to gather dirt). Furthermore, occasoonal rubbing of the exposed jack contacts tends to clean off any accumulated dirt or oxidation, etc. when the radio is worn against clothing or the like.

One conventional way to solve such a problem is to make some or all of the connector terminals movable switch contacts such that externally accessible battery voltage or the like is only provided when the contacts are sufficiently depressed. However, such switch/connectors tend to be relatively costly, mechanically complex and bulky and, in general undesirable.

It often also may be necessary or desirable to modify the modus operandi (i.e., mode of operation) of the basic radio device depending upon the identity of an interconnected accessory device. For example, if an earphone is attached, typically the internal speaker of the basic radio unit should be disconnected and, instead, the receiver audio signals should be routed to the external earphone device. Once again, this sort of switching typically is accomplished by mechanically switchable connector contacts. However, as in the case of electrical power carrying contacts, such movable contact/switch assemblies may often prove unreliable, costly and unduly bulky within modern personal radio devices which must be maintained in a relatively small overall package size. Furthermore, if separate dedicated contacts or the like are required for each different type of external accessory device, then (again partly because of the required small size of these devices), it may only be possible to accommodate a relatively few different types of accessory devices.

The following prior issued U.S. patents, although not directly relating to portable radio systems, may provide a few (nonexhaustive) examples of some prior art approaches to other problems that may, hindsight, have some relationship to the present invention:

U S. Pat. No. 34458,806-Snow (1969)
U.S. Pat. No. 3,464,012-Webb (1969)
U.S. Pat. No. 3,577,076-Frushour et al (1971)
U.S. Pat. No. 3,943,440-Edwards (1976)
U.S. Pat. No. 4,006,396-Bogut (1977)
U.S. Pat. No. 4,491,792-Bullock et al (1985)

Snow provides a sequential tester for measuring the inter-pin impedances of a multi-pin connector as part of a product quality testing arrangement associated with the manufacture of a connected device.

Webb, Frushour et al, and Edwards each teach various types of electrical signal measuring instruments wherein the range or scale selection and/or sensitivity of the measurement device is automatically determined by a corresponding electrical impedance element associated with and connected concurrently to the measuring device with a measurement probe or the like.

Bogut teaches a universal battery charging apparatus wherein a given type of battery pack includes a uniquely corresponding resistance which is connected with the battery so as to become part of the active battery charging circuit. It thus adapts the battery charger to provide proper charging current and potential for that particular battery pack.

Bullock et al provides a special magnetically actuated sensing switch physically associated with a communications port connector so as to provide a proper enabling signal only when a proper communications cable with magnetic actuator is interconnected with it.

It is also known to provide a remote videotape recorder control where a characteristic resistance is connected across a programming lead to signal which of plural push button switches has been activated.

I have now discovered a novel portable radio system of the type which utilizes computer-controlled portable radio communication RF and audio circuits under control of a programmed computer which defines a predetermined modus operandi for the portable radio system. In brief summary, the device includes an externally accessible multi-point electrical connector having input/output connections to the programmed computer which monitors the elettrical impedance externally connected to at least one point of the connector and which alters the modus operandi of the device in response to such monitoring.

For example, the exemplary embodiment provides a circuit which may enable an output voltage supply to an externally connected accessory device only if an electrical impedance of predetermined characteristic value is detected as being connected to a particular enabling pin or contact of the connector. Suitable components for providing such an electrical impedance parameter may be a mere resistor, a zener diode or any other electrical circuit component having precise and predetermined known characteristics not easily duplicated by ambient external conditions likely to be accidentally presented to the externally accessible connection points.

In other words, at least one contact of the universal device connector jack is dedicated to the function of providing an external program control parameter to the internal computer-controlled radio communication circuits. Typically, a discrete electrical component may be connected across the selected programming pin and ground potential where the selected electrical component has a value or characteristic uniquely associated with that particular type of accessory device.

For example, a mere resistor of predetermined resistance may be connected from the programming contact to ground with the value of the resistor being uniquely dependent upon the type of accessory involved. The internal computer-controlled radio circuits then sense the value of such an externally connected resistor and automatically reconfigure the modus operandi of the device in a predetermined way. As previously mentioned, other components such diodes, zeners, inductors, capacitors, etc. and/or combinations thereof may be utilized. However, in the preferred exemplary embodiment, simple resistances are utilized.

Similarly, although the presently preferred exemplary embodiment utilizes one particular technique for measuring the value of such a connected impedance (e.g., by making it part of a conventional voltage divider and then measuring the divided voltage level), many other impedance measuring techniques might alternately be employed (e.g., such as passing a constant current through the external impedance and measuring the value of resulting voltage across the impedance).

In the preferred exemplary embodiment, most if not all of the signals supplied to the external connector interface are electrically switched within the radio under computer-control thus providing very flexible utilization of a limited number of available universal device connector contacts while simultaneously avoiding the necessity of movable switch contacts.

It would be possible to dedicate a larger number of switch contacts to the programming function and then sense "on/off" conditions (e.g., electrically shorted or nonshorted) to identify the connected accessory device in accordance with a binary coded word. However, such an approach is not preferred because it requires the use of too many connector ponnts in the typically small available space requirements. For example, by judicious selection of resistance values, it may be possible to uniquely identify as many as 256 different accessory devices using but a single resistor (of different value, of course, for each type of accessory) and single connector point dedicated to the programming function. To achieve a similar possibility with binary-coded plural programming connector contacts, one would have to devote eight separate contact points to the programming function.

A few examples of auxiliary or accessory devices that might be included in such a portable radio system are: an external speaker or earphone; an external speaker/microphone control unit; an emergency call sensor; a computer or other data source for downloading program data into the radio device and/or for performing automatic tests on the radio device; additional display and/or additional control buttons may also be employed where the radio may be required to operate differently depending upon the style of speaker, microphone, etc. included in the auxiliary device. In one case, the radio may respond to the connection by defeating all local controls on the radio itself provided that those functions are either no longer needed or that they may have been remoted to the accessory device.

The accessory device may itself modify the impedance (e.g., the resistance) of the programming connection so as to further control the modus operandi of the radio. For example, upon connection of a certain auxiliary device, the radio might be programmed to defeat the external control buttons unless an enabling switch is manually activated (e.g., so as to switchably or otherwise change the value of the resistance connected across the programming pin).

These as well other objects and advantages of this invention will be more completely understood and appreciated by carefully reading the following detailed description of a presently preferred exemplary embodiment of the invention, taken in conjunction with the accompanying drawings.

FIG. 2 is a schematic block diagram of suitable electrical circuitry for the exemplary embodiment of FIG. 1;

FIG. 3 is an electrical schematic diagram of an external speaker accessory suitable for use in the portable radio system of FIG. 1;

FIG. 4 is an electrical schematic diagram of a speaker/microphone accessory suitable for use in the portable system of FIG. 1;

FIG. 5 is an electrical schematic diagram of an emergency call accessory suitable for use in the portable radio system of FIG. 1;

FIG. 6 is an electrical block diagram of a computer/program data source accessory suitable for use with the portable radio system of FIG. 1.

Figure 1:
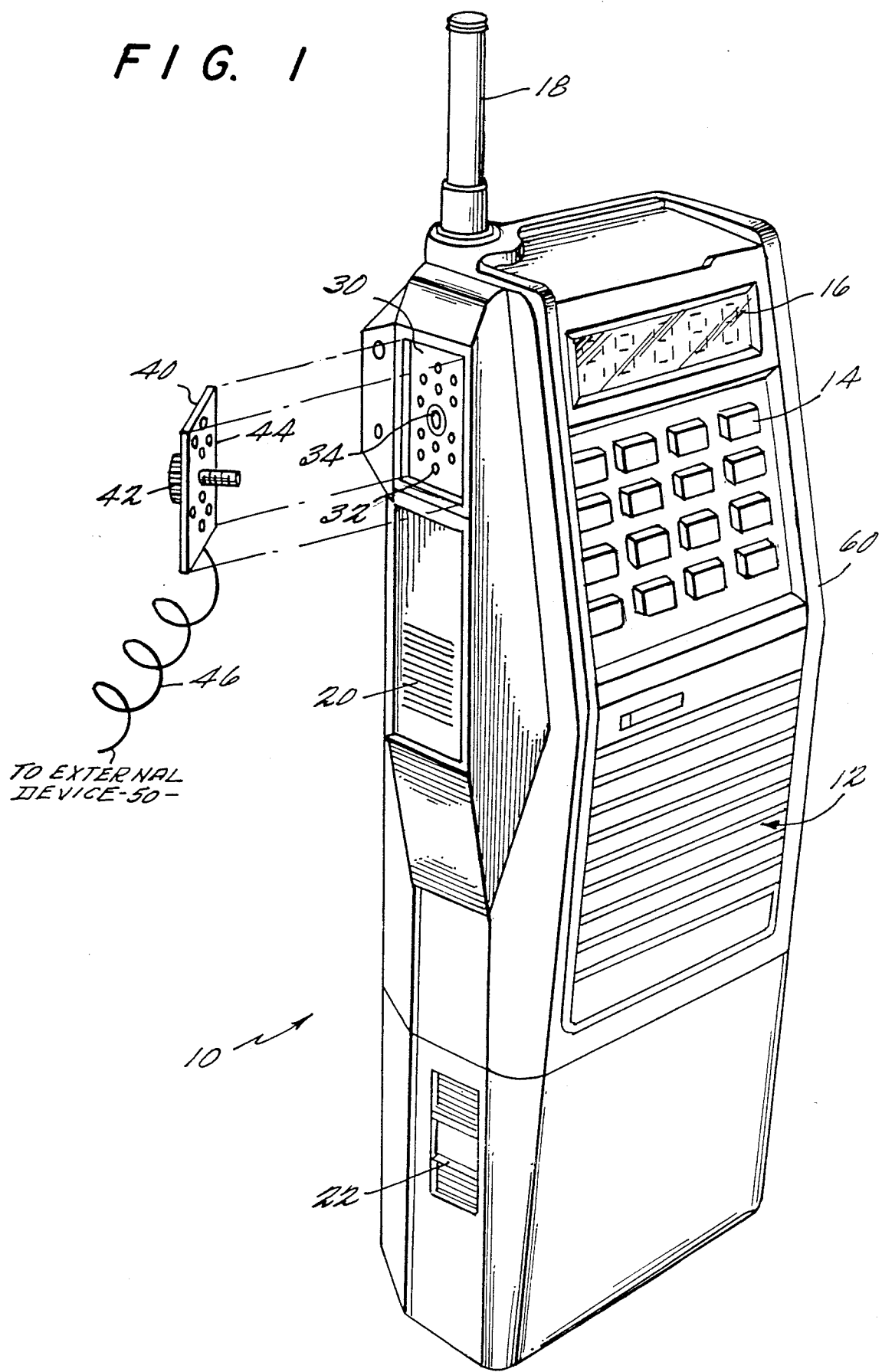
FIG. 1 is a general perspective view of an exemplary embodiment of a portable radio system constructed in accordance with the principles of this invention.

A portable radio system 10 is depicted in FIG. 1. It includes the usual features such as a speaker/microphone 12, function control switches 14, visual display 16, antenna 18 and manually actuatable switches 20, 22. Such devices may be small enough to be hand held and are often carried in a harness structure strapped to a user's body so as to be immediately accessible for use. Typically, in operation, a user might activate the entire unit to an "on" condition via switch 22 and then manipulate switches 14 so as to tune the receiver and/or transmitter to a desired frequency (which may be displayed at 16). Thereafter, switch 20 may be manually activated as a push-to-talk switch in conjunction with a microphone and/or speaker which are housed beneath an acoustic transmission enclosure 12 and alternately utilized depending upon the condition of the push-to-talk (PTT) switch 20. In short, the arrangement includes a computer-controlled portable radio communications device including radio frequency and audio frequency circuits controlled by a programmed computer and using an internal rechargeable battery power supply to define a predetermined modus operandi for the portable radio system.

In the exemplary embodiment of FIG. 1, the portable radio communications device 10 includes an externally accessible multi-point universal device connector jack 30. Typically, such a jack includes plural electrical contact points 32 arrayed about a central screw connector aperture 34 (which also provides an electrical ground connection point in this embodiment). A mating universal device connector plug 40 may include a screw connector 42 and a mating array of similar electrical contact points 44. As will be appreciated by those in the art, the universal device connector plug 40 may be incorporated as part of an external accessory device or it may be connected via cabling 46 to an external accessory device such as those mentioned earlier.

Accordingly, the portable radio system 10 shown in FIG. 1 includes a computer-controlled portable radio communications device 60 and, optionally, may also include an external accessory device 50 electrically connected via universal device jack 30/plug 40.

As is apparent from FIG. 1, the externally accessible electrical contact points 32 typically are exposed and subject to accidental short circuits between the pins and/or between hhe pins and a ground connection or the like in the absence of an installed mating connector plug (or other covering member). Nevertheless, as will be explained in more detail below, these input/output connections to the computer-conrolled device 60 are arranged internally so as not to cause damage to the radio communications device even in the event of such accidental short circuits. Furthermore, in the exemplary embodiment, the computer-controlled device is programmed so as to detect such an accidental short circuit and to respond with an audible warning.

The relevant electrical circuitry is shown in an abbreviated schematic form at FIG. 2. Here, the microprocessor-controlled radio 60 includes the usual microprocessor 100 connected by digital data/control bus circuits 102 to digital memory 104, input/output circuits 106, analog to digital converter circuits 108, radio frequency processing circuits 110 and audio signal processing circuits 112. Typically, the audio circuits 112 and RF circuits 110 are further connected by audio link 114 (e.g., from a discriminator in the RF-IF section and/or to a modulator in the IF-RF section). Insofar as an understanding and practice of the present invention is concerned, the general architecture of such a microprocessor-controlled radio circuit may be of conventional design as will be apparent to those skilled in the art.

In the exemplary embodiment, there are twelve contact points 32 in the universal device jack 30 and a similar mated array of twelve contact points 44 in the universal device connector plug 40. The ground connection is made via the metallic mechanical screw connection 42/34. The I/0 circuits 106 provide an interface for receiving downloaded program/control data over the TX DATA lines and for providing return data signals via the RX DATA line (which data may be transmitted in conventional RS232 serial format). In this manner, different, new, or corrective control program data may be downloaded from an external device into memory 104 for subsequently controlling the operation of microprocessor 100 and, in turn, the modus operandi of the radio device In addition, the I/O circuits 106 permit an interface between the controlling microprocessor 100 (and its associated digital control circuits) and an external push-to-talk switch, an emergency signal switch, a control tone sequence generator switch, transmit/receive function, mute, and perhaps other conventional functions as will be appreciated by those in the art. Squelch or other audio controls may also be itterfaced through the universal device connector jack. In addition, audio input/output connections are provided by the universal device connector jack as shown in FIG. 2.

In addition to such functional interfaces (most or all of which are effectively switch connected into or out of operation by the microprocessor 100) one of the externally accessible pins 32 is labelled "UDC SENSE" in FIG. 2 and it is dedicated to the external programming feature of this invention. As shown in the exemplary embodiment of FIG. 2, this particular externally accessible pin may be connected, through resistance R2, to the internal 5 volt power supply of radio 60. In addition, the voltage appearing on the UDC sense line is monitored at an input of the analog-to-digital converter 108 (which typically may already be included in radio 60 for the purposes of monitoring battery supply voltage levels, RF power output levels, etc.

In the exemplary embodiment of FIG. 2, another one of the externally accessible pins (e.g., TX DATA) is connected, through a resistor R1, to the internal 5 volt power supply of radio 60. Thus, in the absence of any connected external accessory device, the TX DATA line is held "high". The status of this line may be monitored by microprocessor 100 such that if it goes "low" (e.g., if shorted to ground or connected to the RX DATA line which is normally held "low"), then this is taken as a signal that some sort of external accessory device 50 may have been connected and microprocessor 100 then proceeds to determine the value of impedance (e.g., R3 in FIG. 2) that is concurrently connected to the UDC SENSE pin. Since the value of the connected impedance uniquely corresponds to the identity of the external accessory device 50, microprocessor 100 can then determine the identity of that device and take appropriate action so as to properly activate/deactivate the various contact points of the universal device connector jack 30.

In the exemplary embodiment of FIG. 2, one of the accessible pins in jack 30 is labelled EXT PWR and may be used to provide a source of power to the connected external accessory device if transistor 150 has been turned "on" by an appropriate internal output from I/O device 106.

As depicted in FIG. 2, such action would directly connect the EXT PWR terminal of jack 30 to the internal 5 volt power supply of radio 60 (via transistor 150). However, at other times, transistor 150 is "off" and thus no harm may come to radio 60 even if the external power pin is directly shorted to ground or to any other of the externally accessible pins of the universal device connector jack 30. As depicted in FIG. 2, if the external accessory device 50 is connected and if transistor 150 is energized, then this external power pin may provide activating power to a control circuit, amplifier or other active devices contained within the external device. If such a control circuit 160 is included in the external accessory device, then it may in turn be utilized to control the value of resistor R3 connected to the UDC SENSE pin (as indicated by dotted line 162) and thus, in turn, effect a programmed control reaction by microprocessor 100 in radio 60.

As previously mentioned, the TX DATA line may be grounded as indicated by dotted lines 164 or may be connected to the RX DATA line (assuming that this line is normally maintained in a "low" status by radio 60) to signal the connection of a UDC plug 40 to the radio 60. As should be appreciated by those in the art, such a separate provision for sensing the connection of a plug is not absolutely necessary. Instead, the impedance connected to the UDC SENSE pin may itself directly be monitored to signal the connection of an external accessory device.

A possible external speaker accessory is depicted at FIG. 2. Here, it will be seen that an electroacoustic transducer (e.g., a loud speaker) is connected to the audio output pin of the UDC connector (and its ground potential point) while a uniquely characteristic resistance R4 is connected across the UDC sense pin and ground. The TX DATA and RX DATA lines are merely shorted together. When the computercontrolled radio 60 senses the connection of such an external speaker accessory, it may automatically adapt to change its modus operandi by routing the received audio signal to the external speaker or earphone device while disabling operation of the internal speaker device. At the same time, remaining internal functions of the radio 60 (e.g., such as microphone audio input and push-to-talk) may remain normally activated.

An external speaker/microphone accessory is depicted at FIG. 4. Once again, the TX DATA and RX DATA lines are merely shorted together while the UDC sense line is now connected to a uniquely corresponding resistance R5. The audio output pin is connected to a loud speaker as before. A microphone is now connected to the microphone input or audio input pin of the connector while a push-to-talk switch is connected to the external PTT terminal of the connector. When the computer-controlled radio 60 senses the connection of such a speaker/microphone accessory, it may be programmed to react by automatically changing its modus operandi so as to deactivate the normal push-to-talk switch, microphone and speaker of the radio 60 and, instead, to activate appropriate in/out pins of the UDC jack 30 thus remoting these functions to the accessory device.

An emergency call accessory is depicted at FIG. 5. Once again, the TX DATA and RX DATA lines are merely shorted together while the UDC sense line is now connected to a still further unique resistance R6. One of the pins at the UDC jack 30 connected to I/O device 106 is connected to an emergency switch in the auxiliary device and the computer-controlled radio 60 may respond to connection of such an accessory by modifying its modus operandi so as to monitor the condition of the emergency switch. It is often desirable to provide such a switch on a radio so as to automatically transmit an emergency message (e.g. a predetermined call for help on a predetermined frequency) when an easily accessible switch is operated. So as to avoid dedicating space in the basic radio 60 to such a function, the switch alternately may be provided as an optional accessory device via the universal device connector jack 30. Thus, upon sensing both the presence of such a connector and the closure of the emergency switch, the control microprocessor 100 may be programmed to place the radio unit 60 in a transmit mode and to send a predetermined binary message indicating that the user has encountered an emergency situation.

A programming accessory device is depicted at FIG. 6. Here, a still further unique resistance R7 is connected between the UDC sense line and ground. However, since the TX DATA and RX DATA lines are now to be used for transmitting/receiving data in RS232 format, they are connected to a level converter circuit 300 which is, in turn, controlled by a suitable computer device 302. As will be appreciated by those in the art, the computer device 302 may be programmed so as to initially cause level covverter circuit 300 to place a short circuit across the TX DATA/RX DATA lines long enough to establish a changed modus operandi in radio 60 which subsequently will permit transmission/reception of RS232 type serial data over the TX DATA and RX DATA lines.

The level converter circuit 300 may be of conventional design for converting plus/minus 12 volt signals to logic level 0/5 volt signals thus enabling standard computer devices 302 to communicate with the microprocessor 100 over industry standard RS232 type serial interfaces. This permits basic radio data such as channel assignment data for a programmable frequency synthesizer and/or parameters and/or other control program data (e.g., software implemented options such as tone signaling or the like) to be entered and stored in the radio via a temporarily connected accessory device such as that shown in FIG. 6. Furthermore, the accessory of FIG. 6 may be utilized for accessing special software routines already stored within the radio-controlled microprocessor 100 so as to automatically perform test procedures or the like on the internal radio circuits via computer terminal 302.

As will be appreciated by those in the art, the overall control program for micropoocessor 100 may be quite complex. However, insofar as understanding and implementing the present invention as concerned, such standard (albeitccomplex) control algorithms are well known and need not be further elaborated here. Rather, only a modified portion (e.g., a sub routine) of such controlling programs is depicted in the simplified software flowchart of FIG. 7.

For example, at entry point A in a typical conventional control program, an extra conditional logic branch point 700 may be inserted to test the condition of the TX DATA line. If that line ever goes "low", then a branch will be made to the right in FIG. 7. Otherwise, control will continue conventionally so as to connect the internal speaker/microphone/PTT (and/or other functions) at 702. The status of the PTT switch is then tested at 704 and, if depressed, then control is passed to block 706 where the transmit controlling data is loaded to a frequency synthesizer or/and to the audio system and the transmitter is keyed at 708 before control is returned to test point 704. If the PTT switch is not depressed, then a receive function is indicated and control is passed to block 710 where the appropriate receive control data is loaded to the feequency synthesizer and audio system and a test is made at 712 for the condition of the squelch circuit. If the squelch circuit is not open, control is returned to point 700 and, on the other hand, if the squelch circuit is open, then the audio circuits are opened at 714 and audio signals are passed to the appropriate speaker, etc.

It should be appreciated that although a test for the status of the TX DATA line forms the basis for branching to an alternate control sequence in the exemplary embodiment, other arrangements could also be utilized. For example, a voltage below some threshold limit on the UDC sense line itself may be taken directly as an indication of an accessory connection and used in test point 700. Still further, one might simply include all of the alternate control functions (next to be discussed) directly in the basic control line of the controlling program in lieu of test point 700.

Figure 7:
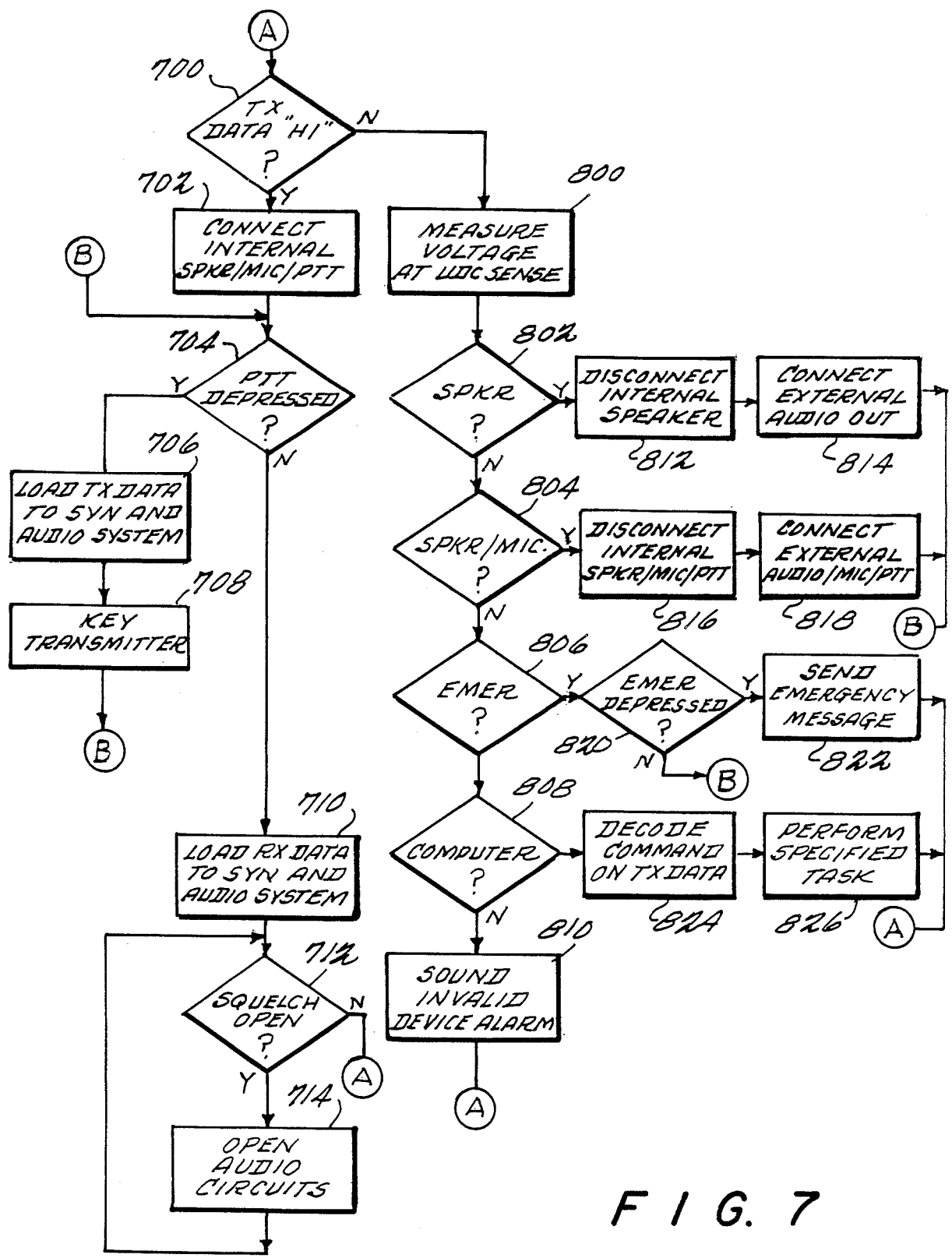
FIG. 7 is a simplified schematic flow diagram of a portion of a suitable control program for use in the microprocessor of the portable radio system of FIG. 1.

The additional functional controls for an exemplary embodiment are depicted at the right hand side of FIG. 7 and are entered from test point 700 whenever the TX DATA line is no longer found to be "high". At such a time, the voltage at the UDC sense terminal is measured at 800 (e.g., by reading an appropriate output from the analog/digital converter 108). As should be appreciated, the measured voltage $V_m$ is directly related to the resistance of the connected resistor (e.g., R3 in FIG. 2) in accordance with th usual voltage divider relationship:

$$V_m = V_b R3/(R2+R3) \quad \text{[equation 1]}$$

Where $V_m$ equals the measured voltage at the UDC sense terminal;

$V_b$ equals the supply or battery voltage (e.g., as may have also just previously been measured with the aid of the A/D converter 108);

R2 equals a known resistance internal to radio 60 (e.g. 10 KΩ);

R3 equals the unknown resistance uniquely associated with a particular accessory control device.

Solving equation one for the unknown resistance R3 yields the following equation:

$$R3 = R2\, V_m/(V_b - V_m) \quad \text{[equation 2]}$$

Of course, there are many ways to measure an impedance. For example, if a constant known current $I_c$ is passed to the UDC sense terminal and the voltage is measured across that terminal, then $R_3 = V_m/I_c$.

Once the voltage at the UDC sense terminal has been measured at step 800, then a succession of tests 802, 804, 806 and 808 are made to determine whether the measured voltage is within a predetermined neighborhood of the expected voltage for given specific predetermined accessory devices. If not, then control is ultimately passed to block 810 where an audible invalid device alarm is sounded before control is passed back to block 700. Thus, if the user does accidentally short the TX DATA and RX DATA terminals, an audible sound will immediately alert the user to that fact and stimulate corrective action.

If an external speaker accessory is identified (e.g., as in FIG. 3), then control is passed to block 812 where the internal speaker of radio 60 is disconnected and then on to block 814 where the external audio output line of the UDC jack 30 is activated before control is passed back to block 704.

If the external speaker/microphone accessory (e.g., FIG. 4) is identified, then control is passed to block 816 where the internal speaker/microphone and PTT switch of radio 60 is disconnected and on to block 18 where the I/O pins of UDC jack 30 are activated so as to remote the audio/microphone/PTT functions before control is passed back to block 704.

If the emergency accessory device is identified, then a test is made at 820 for the status of the emergency switch. If it has not been depressed, then control is passed back to block 704 for normal operation. However, if the emergency switch has been depressed, then control is passed to block 822 where an emergency message is sent before control is passed back to block 700.

If the external program or computer data source is identified, then control is passed to block 824 where a command on TX DATA line is decoded and the specified task (e.g., to provide output data on the RX DATA line and/or to accept data from the TX DATA line) is performed at block 826 before control is passed back to decision point 700.

While only a few exemplary embodiments of this invention have been described in detail, those skilled in the art will recognize that many modifications and variations may be made in the exemplary embodiment while yet retaining many of the novel features and advantages of this invention. Accordingly, the appended claims are intended to cover all such variations and modifications.

What is claimed is:

1. A portable radio system comprising:
   a computer-controlled portable radio communications device having RF and audio circuits controlled by a programmed computer means to define a predetermined mode of operation for the portable radio system;
   said portable radio communications device including an externally accessible multi-point electrical connector which includes input/output connections to said programmed computer means; and
   said programmed computer means being programmed (a) to monitor an electrical impedance externally connected to at least one point of said connector and (b) to alter said mode of operation in response to said monitoring.

2. A portable radio system comprising:
   a computer-controlled portable radio communications device having RF and audio circuits controlled by a programmed computer means to define a predetermined mode of operation for the portable radio system;
   said portable radio communications device including an externally accessible mult-point electrical connector which includes input/output connections to said programmed computer means;
   said programmed computer means being programmed (a) to monitor an electrical impedance externally connected to at least one point of said connector and (b) to alter said mode of operation in response to said monitoring;
   said multi-point electrical connector being a universal device connector jack having exposed electrical contacts, at least one of which contacts being connected to an internal source of electrical current and which accidentally may be shorted across by a user in the absence of an installed mated connector plug or other convering member;
   said input/output connections being arranged so as not to cause damage to said radio communications device in the event of such an accidental shorting; and
   said computer being programmed to detect such an accidental shorting and to respond with an audible warning.

3. A portable radio system as in claim 2 wherein:
   a first one of said exposed contacts is connected through a first impedance to a source of electrical energy which maintains said first contact at a first predetermined voltage level unless it is externally shorted to a ground potential point whereupon said first contact is reduced to substantially zero voltage; and
   a second one of said exposed contacts is connected through a second impedance to said source of electrical energy, which second impedance forms a voltage divider with a third impedance externally connected to said second contact; and said programmed computer means is programmed (1) to detect a zero voltage condition at said first contact as representing the possible connection of an external device to said connector and (2), in response, to measure the voltage at said second contact, to determine if said measured voltage corresponds to one of plural predetermined values associated with a corresponding plurality of predetermined external devices, to alter the mode of operation accordingly if such correspondence is detected, and to sound an audible signal if the measured voltage does not correspond to one of said plural predetermined values.

4. A portable radio system comprising:
a computer-controlled portable radio communications device having RF and audio circuits controlled by a programmed computer means to define a predetermined mode of operation for the portable radio system;
said portable radio communications device including an externally accessible mult-point electrical connector which includes input/output connections to said programmed computer means;
said programmed computer means being programmed (a) to monitor an electrical impedance externally connected to at least one point of said connect and (b) to alter said mode of operation in response to said monitoring;
an external speaker accessory having (1) a second multi-point electrical connector mated to the first-mentioned connector on said portable device, (2) an electroacoustic transducer connected to at least one contact point of the second connector, and (3) a predetermined electrical impedance uniquely corresponding to said external speaker accessory connected to at least one other contact point of the second connector; and
said programmed computer meass being programmed to identify said predetermined electrical impedance when said connectors are matingly connected and, in response, to supply audio electrical signals to the elctroacoustic transducer via said mated connectors.

5. A portable radio system comprising:
a computer-controlled portable radio communications device having RF and audio circuits controlled by a programmed computer means to define a predetermined mode of operation for the portable radio system;
said portable radio communications device including an externally accessible mult-point electrical connector which includes input/output connections to said programmed computer means;
said programmed computer means being programmed (a) to monitor an electrical impedance externally connected to at least one point of said connector and (b) to alter said mode of operation in response to said monitoring;
a speaker/microphone accessory having (1) a second multi-point electrical connector mated to the first-mentioned connector, (2) an electroacoustic transducer connected to at least a first contact point of the second connector, (3) a microphone connected to at least a second contact point of the second connector, (4) a push-to-talk switch connected to at least a third contact point of the second connector, and (5) a predetermined electrical impedance uniquely corresponding to said speaker/microphone accessory and connected to at least a fourth contact point of said second connector; and
said programmed computer means being programmed to identify said predetermined electrical impedance when the connectors are matingly connected and, in response, via said connectors, (1) to supply audio electrical signals to the electroacoustic transducer, and (2) to accept audio electrical signals from said microphone when said push-to-talk switch is activated.

6. A portable radio system comprising;
a computer-controlled portable radio communications device having RF and audio circuits controlled by a programmed computer means to define a predetermined mode of operation for the portable radio system;
said portable radio communications device including an externally accessible multi-point electrical connector which includes input/output connections to said programmed computer means;
said programmed computer means being programmed (a) to monitor an electrical impedance externally connected to at least one point of said connector and (b) to alter said mode of operation in response to said monitoring;
an emergency call accessory having (1) a secnd multi-point electrical connector mated to the first-mentioned connector, (2) an emergency switch connected to at least a first contact point of said second connector, and (3) a predetermined electrical impedance uniquely corresponding to said emergency call accessory connected to at least a second contact point of said second connector; and
said programmed computer means being programmed to identify said predetermined electrical impedance when said connectors are matingly connected, and in response, via said connectors to monitor the status of said emergency switch and to automatically transmit a predetermined signal if the emergency switch is activated.

7. A portable radio system comprising:
a computer-controlled portable radio communications device having RF and audio circuits controlled by a programmed computer means to define a predetermined mode of operation for the portable radio system;
said portable radio communications device including an externally accessible multi-point electrical connector which includes input/output connections to said programmed computer means;
said programmed computer means being programmed (a) to monitor an electrical impedance externally connected to at least one point of said connector and (b) to alter said mode of operation in response to said monitoring;
a programming accessory having a (1) second multi-point electrical connector mated to the first-mentioned connector, (2) a source of program data for downloading to said programmed computer means and connected to at least a first contact point of said second connector, and (3) a predetermined electrical impedance uniquely corresponding to said programming accessory and connected to at least a second contact point of said connector;
said programmed computer means being programmed to identify said predetermined electrical impedance when said connectors are matingly connected and, in response, to accept said program data when downloaded thereto via said connectors.

8. A portable radio system comprising:
a portable radio communications device having RF and audio circuits;
said portable radio communications device including an externally accessible multi-point electrical connector;
said portable radio communications device including an internal battery source of electrical energy and said multi-point electrical connector having at least one first connecoor point electrically connected to said battery through an active switch controlled to normally reside in an open condition thus presenting an externally accessible power source via said first connector point only when said active switch is controlled to a closed condition; and
means for monitoring an electrical impedance externally connected to at least one second connector point of said connector and for controlling said active switch to its closed condition in response to detection of a predetermined impedance connected thereto.

9. A portable radio system comprising:
a portable radio communications device having RF and audio circuits;
said portable radio communications device including an externally accessible multi-point electrical connector;
said portable radio communications device including a internal battery source of electrical energy and said multi-point electrical connector having at least one first connector point electrically connected to said battery through an active switch controlled to normally reside in an open condition thus presenting an externally accessible power source via said first connector point only when said active switch is controlled to a closed condition; and
means for monitoring an electrical impedance externally connected to at least one second connector point of said connector and for controlling said active switch to its closed condition in response to detection of a predetermined impedance connected thereto;
wherein, in response to said detecton, said means for monitoring also alters the mode of operation of said communications device by remoting some device functions to an accessory device connected thereto via said connector.

10. A portable radio system comprising:
a portable radio communications device having RF and audio circuits;
said portable radio communications device including an externally accessible multi-point electrical connector;
said portable radio communications device including an internal battery source of electrical energy and said multi-point electrical connector having at least one first connector point electrically connected to said battery through an active switch controlled to normally reside in an open condition thus presenting an externally accessible power source via said first connector point only when said active switch is controlled to a closed condition; and
means for monitoring an electrical impedance externally connected to at least one second connector point of said connector and for controlling said active switch to its closed condition in response to detection of a predetermined impedance connected thereto;
wherein said portable radio communications means for monitoring also causes an audible warning to issue from said device in the event of an accidental short-circuit connection to at least one of the connector points.

11. A portable radio system comprising:
a portable radio communications device having RF and audio circuits;
said portable radio communications device including an externally accessible multi-point electrical connector;
said portable radio communications device including an internal battery source of electrical energy and said multi-point electrical connector having at least one first connector point electrically connected to said battery through an active switch controlled to normally reside in an open condition thus presenting an externally accessible power source via said first connector point only when said active switch is controlled to a closed condition; and
means for monitoring an electrical impedance externally connected to at least one second connector pont of said connector and for controlling said active switch to its closed condition in response to detection of a predetermined impedance connected thereto;
wherein said means for monitoring comprises a programmed computer means including an analog-to-digital converter connected to provide to said computer a digital signal representing the voltage present at said second connector point.

12. A portable radio system comrising:
a portable radio communications device having, (a) RF and audio circuits, (b) an internal battery power source, (c) a first externally accessible multi-point electrical connector, and (d) control means interconnecting said connector with said RF and audio circuits and power source and providing a predetermined mode of operation; and
an accessory device including, (a) internal devices needing electrical power and capable of providing remote communications features if provided with proper I/O interfacing to said portable device, (b) a second externally accessible multi-point electrical connector mated to said first connector and capable of providing said porper I/O interfacing when connected, and a predetermined electrical impedance uniquely corresponding in value to the identity of said accessory device and connected to at least one sense connection point of said second connector;
said control means being connected to monitor and detect the value of electrical impedance connected to said sense connection and, in response, to alter said mode of operating by generating said proper I/O interface via said mated connectors while simultaneously providing electrical power to said accesory device via said mated connectors.

13. A portable radio system as in claim 12 wherein said control means also includes means for issuing an audible warning in the event of an accidental short circuit across a contact point of said first connector which is normally supplied with an electrical potential.

14. A portable radio system as in claim 8 wherein said control means comprises a progammed computer apparatus having an analog-to-digital converter connected to provide a digital signal representing a voltage present at a sense connection point of the first connector.

15. A method for controlling the mode of operation of a computer-controlled portable radio communications device having RF and radio circuits controlled by a programmed computer to define a predetermined mode of operation for the portable radio system and including an externally accessible multi-point electrical connector which includes input/output connections to said programmed computer, said method comprising the steps of:
- monitoring an electrical impedance extenally connected to at least one point of said connector with said computer, and
- altering said mode of operation with said computer in response to said monitoring.

16. A method for controlling the mode of operation of a computer-controlled portable radio communications device having RF and radio circuits controlled by a programmed computer to define a predetermined mode of operation for the portable radio system and including an externally accessible multi-point electrical connector which includes input/output connections to said programmed computer, said method comprising the steps of:
- monitoring an electrical impedance externally connected to at least one point of said connector with said computer,
- altering said mode of operation with said computer in response to said monitoring,
- wherein said multi-point electrical connector is a universal device connector jack having exposed electrical contacts, at least one of which contacts is connected to an internal source of electrical current and which accidentally may be shorted across by a user in the absence of an installed mated connector plug or other covering member, said input/output connections being arranged so as not to cause damage to said radio communications device in the event of such an accidental shorting; and
- detecting such an accidental shorting and responding with an audible warning.

17. A method as in claim 16 wherein a first one of said exposed contacts is connected through a first impedance to a source of electrical energy which maintains said first contact at a first predetermined voltage level unless it is externally shorted to a ground potential point whereupon said first contact is reduced to substantially zero voltage, and a second one of said exposed contacts is connected through a second impedance to said source of electrical energy, which second impedance forms a voltage divider with a third impedance externally connected to said second contact, and, further comprising the steps of:
- detecting a zero voltage condition at said first contact as representing the possible connection of an external device to said connector, and
- in response to such detection, measuring the voltage at said second contact, determining if said measured voltage corresponds to one of plural predetermined values associated with a corresponding plurality of predetermined external devices, altering the modus operandi accordingly if such correspondence is detected, and sounding an audible signal if the measured voltage does not correspond to one of said plural predetermined values.

18. A method for controlling the mode of operation of a computer-controlled portable radio communications device having RF and radio circuits controlled by a programmed computer to define a predetermined mode of operation for the portable radio system and including an externally accessible multi-point electrical connector which includes input/output connections to said programmed computer, said method comprising the steps of:
- monitoring an electrical impedance externally connected to at least one point of said connector with said computer,
- altering said mode of operation with said computer in response to said mnnitoring,
- wherein an external speaker accessory having (1) a second multi-point electrical connector is mated to the first-mentioned connector on said portable device, (2) an electroacoustic transducer is connected to at least one contact point of the second connector, and (3) a predetermined electrical impedance uniquely corresponding to said external speaker accessory is connected to at least one other contact point of the second connector, and
- identifying said predetermined electrical impedance when said connectors are matingly connected and, in response, supplying audio electrical signals to the electroacoustic transducer via said mated connectors.

19. A method for controlling the mode of operation of a computer-controlled portable radio communications device having RF and radio circuits controlled by a programmed computer to define a predetermined mode of operation for the portable radio system and including an externally accessible multi-point electrical connector which includes input/output connections to said programmed computer, said method comprising the steps of:
- monitoring an electrical impedance externally connected to at least one point of said connector with said computer,
- altering said mode of operation with said computer in response to said monitoring,
- wherein a speaker/microphone accessory having (1) a second multi-point electrical connector is mated to the first-mentioned connector, (2) an electroacoustic transducer is connected to at least a first contact point of the second connector, (3) a microphone is connected to at least a second contact point of the second connector, (4) a push-to-talk switch is connected to at least a third contact point of the second connector, and (5) a predetermined electrical impedance uniquely corresponding to said speaker/microphone accessory is connected to at least a fourth contact point of said second connector, and
- identifying said predetermined electrical impedance when the connectors are matingly connected and, in response, via said connectors, (1) supplying audio electrical signals to the electracoustic transducer, and (2) accepting audio electrical signals from said microphone when said push-to-talk switch is activated.

20. A method for controlling the mode of operation of a computer-controlled portable radio communications device having RF and radio circuits controlled by a programmed computer to define a predetermined mode of operation for the portable radio system and including an externally accessible multi-point electrical connector which includes input/output connections to said programmed computer, said method comprising the steps of:
- monitoring an electrical impedance externally connected to at least one point of said connector with said computer,
- altering said mode of operation with said computer in response to said monitoring,
- wherein an emergency call accessory having (1) a second multi-point electrical connector is mated to the first-mentioned connector, (2) an emergency switch is connected to at least a first contact point of said second connector, and (3) a predetermined electrical impedance uniquely corresponding to said emergency call accessory is connected to at least a second contact point of said second connector, and
- identifying said predetermined electrical impedance when said connectors are matingly connected, and in response, via said connectors, monitoring the status of said emergency switch and automatically transmitting a predetermined signal if the emergency switch is activated.

21. A method for controlling the mode of operation of a computer-controlled portable radio communications device having RF and radio circuits controlled by a programmed computer to define a predetermined mode of operation for the portable radio system and including an externally accessible multi-point electrical connector which includes input/output connections to said programmed computer, said method comprising the steps of:
- monitoring an electrical impedance externally connected to at least one point of said connector with said computer,
- altering said mode of operation with said computer in response to said monitoring,
- wherein a programming accessory having a (1) second multi-point electrical connector is mated to the first-mentioned connector, (2) a source of program data for downloading to said computer is connected to at least a first contact point of said second connector, and (3) a predetermined electrical impedance uniquely corresponding to said programming accessory is connected to at least a second contact point of said connector, and
- identifying said predetermined electrical impedance when said connectors are matingly connected and, in response, downloading programming signals to said computer via said connectors.

* * * * *